United States Patent
Tillotson

(10) Patent No.: US 8,619,435 B2
(45) Date of Patent: Dec. 31, 2013

(54) ELECTROMAGNETIC INTERFERENCE (EMI) DIVERTER

(75) Inventor: John Kenneth Tillotson, Petoskey, MI (US)

(73) Assignee: Honeywell International Inc., Morristown, NJ (US)

( * ) Notice: Subject to any disclaimer, the term of this patent is extended or adjusted under 35 U.S.C. 154(b) by 133 days.

(21) Appl. No.: 12/830,986

(22) Filed: Jul. 6, 2010

(65) Prior Publication Data

US 2012/0006593 A1  Jan. 12, 2012

(51) Int. Cl.
*H05K 9/00* (2006.01)
(52) U.S. Cl.
USPC ............ 361/816; 361/818; 361/728; 361/799
(58) Field of Classification Search
USPC .................................. 361/816, 818, 728, 799
See application file for complete search history.

(56) References Cited

U.S. PATENT DOCUMENTS

| | | | |
|---|---|---|---|
| 5,717,577 A * | 2/1998 | Mendolia et al. | 361/818 |
| 7,488,901 B2 * | 2/2009 | Arnold | 174/377 |
| 2003/0017646 A1 * | 1/2003 | Sridharan et al. | 438/106 |
| 2005/0052858 A1 * | 3/2005 | Shima | 361/814 |

* cited by examiner

*Primary Examiner* — Timothy Thompson
*Assistant Examiner* — Andargie M Aychillhum
(74) *Attorney, Agent, or Firm* — Ingrassia Fisher & Lorenz, P.C.

(57) ABSTRACT

An external EMI diverting structure to electrically shield an electronic device from EMI is presented. The electronic device is physically isolated from the case ground which interrupts the EMI or lightning fault path. This shield provides a return path to ground for the EMI away from the electronic device and replaces conventional EMI filter capacitors, which are not connected to case ground. The external EMI diverter comprises a first conducting enclosure enclosing the electrical circuit and is electrically coupled to the electric circuit and a second conducting enclosure enclosing the first conducting enclosure and being electrically isolated from the first conducting enclosure and the electric circuit. The diverter is physically and electrically connected to the case ground at an attachment point.

14 Claims, 4 Drawing Sheets

ELECTROMAGNETIC INTERFERENCE (EMI) DIVERTER

TECHNICAL FIELD

The present invention generally relates to electronic circuits, and more particularly relates to circuits that are hardened to lightning and other electromagnetic interference (EMI).

BACKGROUND

Proximity sensors and other electronic devices have long been used to sense when a device or component is operating within predefined tolerances. In many instances, the signals generated by a proximity sensor may be used to selectively enable and disable various portions of a system. For example, if a proximity sensor senses that a device or component is within a predetermined distance of a reference location, this may indicate an undesired configuration. In such an instance, the sensor output signal may be used to disable a system (or portion thereof). Conversely, if a device or component being within a predetermined distance of a reference location is a desired configuration, the sensor output signal may be used to enable a system (or a portion thereof).

Sensors and other electronic devices have been, and continue to be used, on various types of aircraft. Many aircraft structures are now built using relatively lightweight non-conducting composite materials thus providing less shielding against lightning strikes and other types of electromagnetic interference (EMI), such as radio frequency interference. As a result, both EMI specification levels and dielectric strength requirements for systems and components that are installed in these environments have increased. Current state of the art sensors and other circuits typically use filter capacitors for EMI protection. However, the filter capacitors are typically coupled from internal wiring to a chassis and may provide an undesirable path for lightning currents to be conducted into other sensitive electronic equipment connected to the wiring. Presently, electronic circuits that can withstand more hostile lightening and radio frequency EMI environments are not readily available.

Hence, there is a need for EMI protection devices that that can withstand the increasingly difficult lightening and radio frequency EMI environments. The present invention addresses at least this need.

BRIEF SUMMARY

An apparatus is provided for diverting EMI from an electric circuit. The apparatus comprises a first conducting enclosure that encloses the electrical circuit and is electrically coupled to the electric circuit. The first conducting enclosure has an inside surface and an outside surface. The apparatus also comprises a second conducting enclosure that encloses the first conducting enclosure and is electrically isolated from both of the first conducting enclosure and the electric circuit. The second conducting enclosure also includes an attachment point that connects the second conducting enclosure to ground.

An apparatus is provided for diverting EMI from an electric circuit. The apparatus comprises a first means for enclosing the electrical circuit and a second means for enclosing the first means. The first means for enclosing the second means is electrically isolated from the electric circuit and from the first means. The apparatus also includes a third means for connecting the first means to ground.

A method is provided for diverting EMI from an electric circuit. The method comprises providing a first conducting enclosure enclosing the electrical circuit and being electrically coupled to the electric circuit and providing a second conducting enclosure enclosing the first conducting enclosure, which is electrically isolated from the first conducting enclosure and the electric circuit. The method also includes attaching the second conducting enclosure to ground via an attachment point.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

The exemplary embodiment disclosed herein is an external EMI diverting structure to electrically shield an electronic device or circuit from EMI. The electronic device is isolated from the case ground which interrupts the radio frequency and/or lightning fault path. This diverting structure provides also provides a capacitatively coupled return path to case ground for the EMI away from the electronic device.

The external EMI diverting structure is constructed from a metallic conductor case and a conducting enclosure. The metallic conductor case is configured to function as an isolated ground plane that provides a physical attachment point to a larger structure serving as the case ground.

Figure 1B:
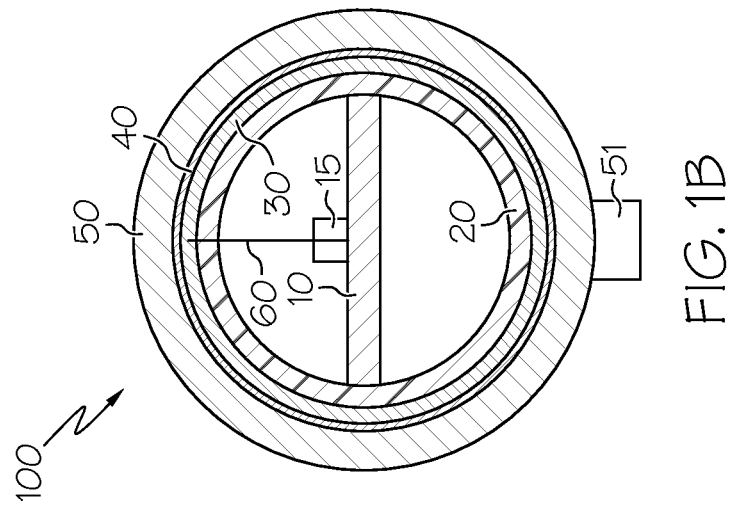
FIGS. 1A and 1B are cross sectional side and end views of an embodiment of an EMI diverter according to an exemplary embodiment.
Figure 1A:
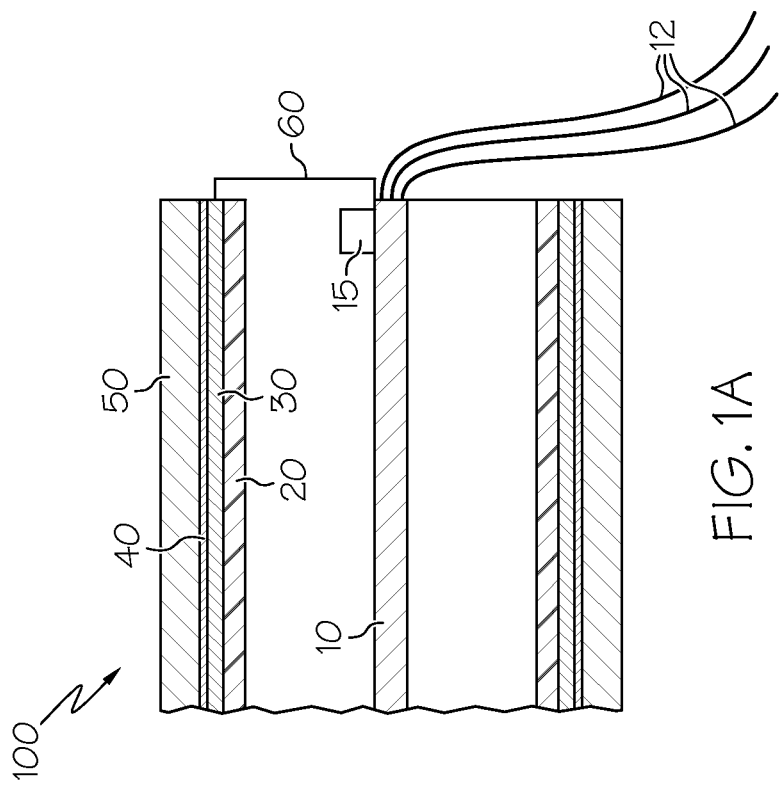

Referring first to FIG. 1, a simplified diagram of an embodiment of the external EMI diverter 100 is provided. FIG. 1 is not drawn to scale. Although depicted as a cylinder, the EMI diverter 100 may utilize any suitable form factor. Non-limiting examples of a suitable form factor includes a sphere, a cone, a parallelepiped, a cuboid and/or a combination thereof.

The external EMI diverter 100 protects the electric circuit 10 from lightening and other sources of electromagnetic interference, which will together be referred to hereinafter as EMI. A non-limiting example of other sources of electromagnetic interference is radio frequency EMI. Typically, any EMI within the circuit board 10 enters via the leads 12 to the circuit board as they are unshielded or marginally shielded. The EMI is stripped from any incoming signal by lightning transient suppressors capacitors, inductors and other electronic components 15 ("stripping electronics").

The external EMI diverter 100 further comprises a shunt 60. The shunt 60 is physically and electrically attached to the circuit board 10 and may be constructed from any material or structure that is capable of conducting an electronic signal or charge. As non-limiting examples, the shunt 60 may be made of a conductor, or an appendage of the substrate of the circuit board 10 and/or a combination thereof.

The external EMI diverter 100 further comprises an inner conducting enclosure 20. In some embodiments the inner conducting enclosure 20 may comprise a dielectric material. The dielectric material may be a weak dielectric material. Non-limiting examples of dielectric materials include plastics (e.g. polyethylene), a vacuum, air, helium, nitrogen, porcelain, mica, glass and various metal oxides known in the art.

When the inner conducting enclosure 20 is made of a dielectric material, the outside surface of the inner conducting enclosure 20 is coated with a metallic layer 30. The metallic layer 30 may be a separate component such as a sleeve. In other embodiments the metallic layer 30 and may be sprayed, electroplated or otherwise deposited on the exterior surface of the inner conducting enclosure 20. The metallic layer 30 may comprise any suitable metal or metal alloy. Non-limiting examples of suitable metals includes copper, nickel, aluminum, gold, silver, and alloys thereof.

In still other embodiments, the inner conducting enclosure 20 may comprise a conducting material, in which case the metallic layer 30 may be dispensed with as being redundant. The inner conducting enclosure 20 may comprise any suitable metal or metal alloy. Non-limiting examples of suitable metals includes brass, aluminum alloys, silver alloys, gold alloys, and nickel alloys.

Surrounding the metallic layer 30 and the shunt 60 is an insulating layer 40. This insulating layer must have sufficient dielectric strength to withstand the high voltages associated with lightening events. The insulating layer 40 may comprise any suitable electric insulation such as epoxy, polyamide (e.g. Kapton®) and polytetrafluoroethylene (e.g. Teflon®). Kapton® and Teflon® are both made by E.I. du Ponte de Nemours & Co. of Wilmington, Del. The insulating layer 40 may be a sheath or film of material. In some embodiments the insulating layer 40 may be applied in the form of tape or liquid instead of a solid sheath or film. The insulating layer may be secured or potted to with adhesives as needed to achieve mechanical strength and rigidity between the two enclosures.

Surrounding the insulating layer 40 is an exterior casing 50. The exterior casing 50 comprises a conductive enclosure that may be attached to another structure (not shown) via one or more anchor points 51. The exterior casing 50 may be made of any suitable metallic element or alloy. Non-limiting examples of suitable metals include aluminum, iron, nickel, copper, and alloys thereof, such as stainless steel or nickel-chromium based super alloys such as Inconel® made by Special Metals Corporation of New Hartford, N.Y. The exterior casing 50, the inner conductive enclosure 20/30 and the insulating layer 40 located therebetween, comprise a low value functional capacitor with a high dielectric strength. The external casing provides protection from the environments and may hermetically seal the external EMI diverter 100. The insulating layer may be secured or potted to the exterior casing 50 with adhesives as needed to achieve mechanical strength and rigidity between the conducting enclosure 20/30 and the exterior casing 50.

As depicted in FIG. 1, the shunt 60 is electrically and physically attached to the circuit board 10 at one end and electrically coupled and/or physically attached to the metallic layer 30. In embodiments where the inner conductive enclosure 20 is a conductor, the shunt 60 may be electrically and physically connected to the inner conductive enclosure 20.

In operation, any EMI traveling with incoming data signals over the leads 12 will be stripped from the incoming signals by the stripping electronics 15 on the circuit board 10 as is well known in the art. The EMI will travel from the stripping electronics 15 through shunt 60 to the inner conductive enclosure 20/30. From the inner conductive enclosure 20/30, the EMI is capacitatively coupled across the insulating layer 40 to the exterior casing 50 and hence to the surrounding case ground via the attachment point 51.

Figure 2:
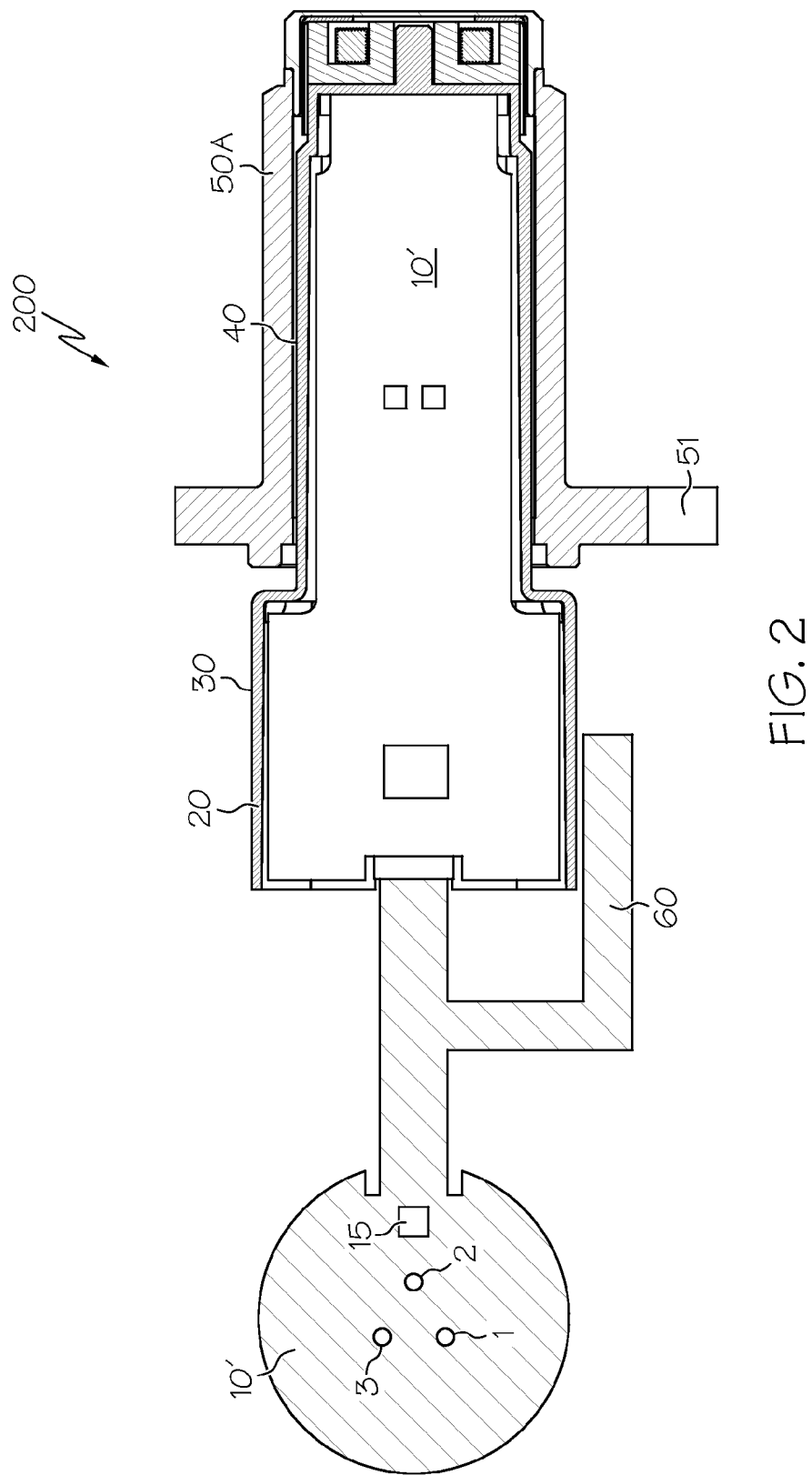
FIG. 2 is a cross sectional plan view of a partially assembled embodiment of an EMI diverter according to an exemplary embodiment.

FIG. 2 is a cross sectional plan view of an exemplary embodiment of an external EMI diverter 200 where like numbers refer to like numbers in FIG. 1. The embodiment of FIG. 2 includes a foldable circuit board 10' which includes connection points 1-3 for the leads 12. The embodiment of FIG. 2 is depicted partially assembled with only a partial outer casing 50A. The embodiment of FIG. 2 also includes the inner conductive enclosure 20 with the metallic layer 30 and the insulating layer 40 attached to the inside surface of the exterior casing 50. In other embodiments the inner conductive enclosure 20 may be entirely metallic instead of a dielectric with the metallic layer 30.

Figure 3:
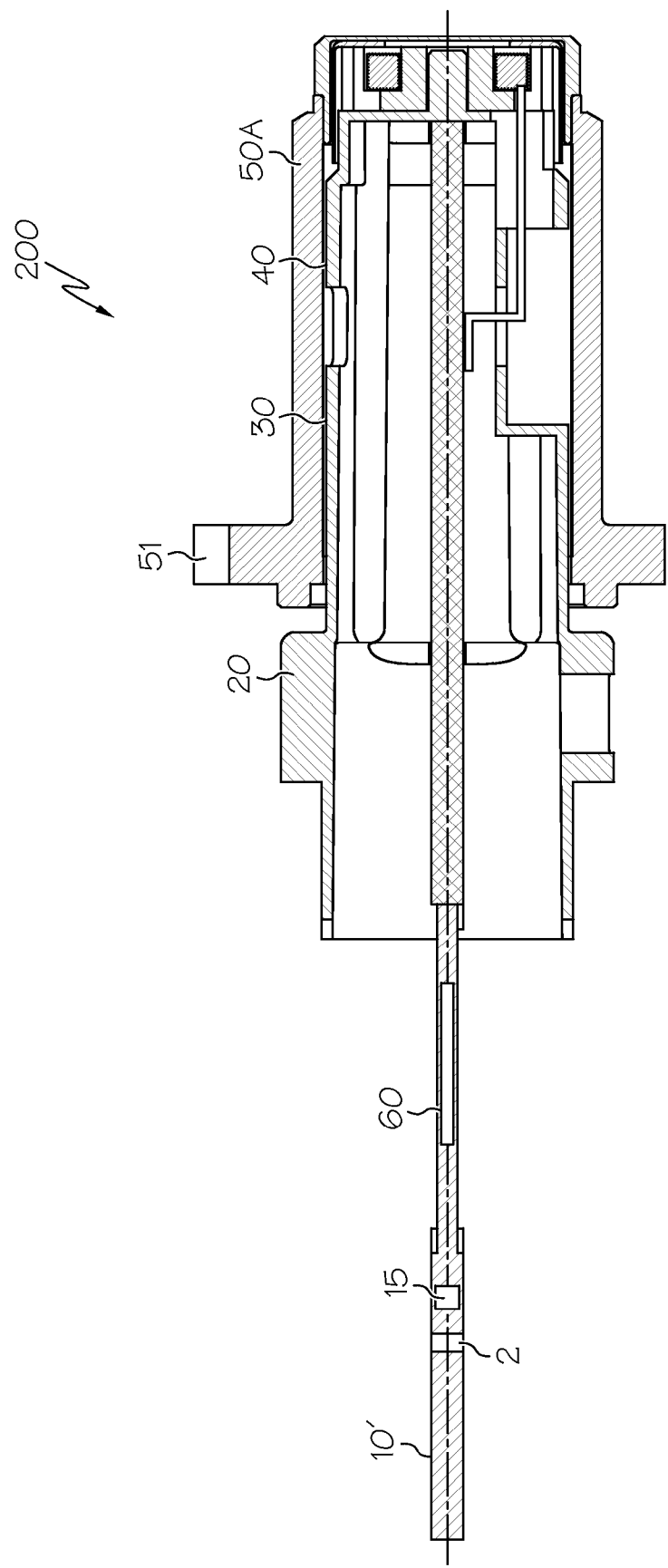
FIG. 3 is a cross sectional side view of the partially assembled embodiment of FIG. 2.

FIG. 3 is a side view of the external EMI diverter 200 of FIG. 2.

Figure 4:
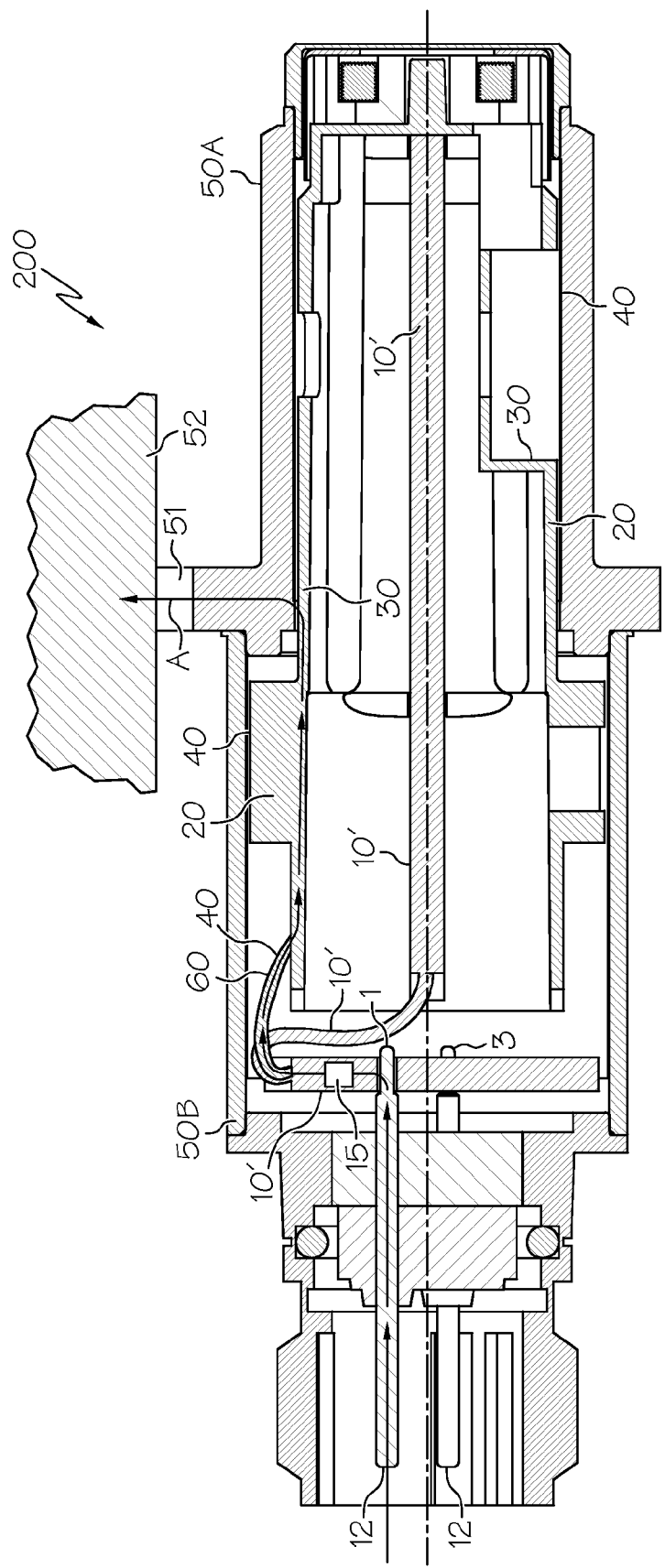
FIG. 4 is a cross sectional side view of the fully assembled embodiment of FIG. 2.

FIG. 4 is a side view of the fully assembled external EMI diverter 200. The circular left portion of the flexible circuit board 10' has been folded downward into a position that is perpendicular to the rest of the flexible circuit board 10'. Leads 12 are connected to the connection points 1-3. Connection point 2 is located directly behind connection point 1 and is not visible. The shunt 60, attached to the flexible circuit board 10', is connected to the metallic layer 30 of the inner conducting enclosure 20, thereby completing a conductive path "A" from the stripping circuitry 15 to the case ground 52 via the exterior casing 50 A-B and attachment point 51. The exterior casing 50 A-B may hermetically seal the external EMI diverter 200.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention.

What is claimed is:

1. An external electromagnetic interference (EMI) diverter to protect an electric circuit, comprising:
    a first conducting enclosure enclosing the electrical circuit and being electrically coupled to a circuit board including the electric circuit, the first conducting enclosure having an inside surface and an outside surface;
    a second conducting enclosure enclosing the first conducting enclosure and being electrically isolated from the first conducting enclosure and the electric circuit, wherein the first conducting enclosure is capacitatively coupled to the second conducting enclosure; and an attachment point configured for connecting the second conducting enclosure to ground.

2. The EMI diverter of claim 1 further comprising:
an insulating layer medial to the first conducting enclosure and the second conducting enclosure.

3. The EMI diverter of claim 2 further comprising:
a shunt physically and electrically coupling the electric circuit to the first conducting enclosure.

4. The EMI diverter of claim 2, wherein the first conducting enclosure comprises a dielectric material.

5. The EMI diverter of claim 4, wherein the first conducting enclosure further comprises a metallic layer bonded to the outside surface of the first conduction enclosure.

6. The EMI diverter of claim 5, wherein the shunt is physically and electrically connected to the metallic layer.

7. The EMI diverter of claim 4, wherein the dielectric material is a weak dielectric.

8. The EMI diverter of claim 2, wherein the insulating layer comprises a polyamide film.

9. The EMI diverter of claim 2, wherein the insulating layer comprises of polyamide tape.

10. The EMI diverter of claim 1, wherein the first conducting enclosure is entirely metallic.

11. An external electromagnetic interference (EMI) diverter to protect an electric circuit, comprising:
means for enclosing the electrical circuit;
means for enclosing the means for enclosing the electrical circuit, the means for enclosing the means for enclosing the electrical circuit being electrically isolated from the electric circuit and from the means for enclosing the electrical circuit, wherein the means for enclosing the means for enclosing the electrical circuit is capacitatively coupled to the means for enclosing the electrical circuit; and
means for connecting the means for enclosing the means for enclosing the electrical circuit to ground.

12. The EMI diverter of claim 11 further comprising:
a means for insulating the first means from the second means.

13. The EMI diverter of claim 11 further comprising:
means for physically and electrically coupling the electric circuit to the means for enclosing the electrical circuit.

14. The EMI diverter of claim 13, wherein the means for enclosing the electric circuit is capacitatively coupled to the means for enclosing the means for enclosing the electric circuit.

* * * * *